United States Patent
Wang et al.

(10) Patent No.: US 6,716,740 B2
(45) Date of Patent: Apr. 6, 2004

(54) METHOD FOR DEPOSITING SILICON OXIDE INCORPORATING AN OUTGASSING STEP

(75) Inventors: Shih-Ming Wang, Tainan (TW); Long-Shang Chuang, Tainan (TW); Jui-Ping Chuang, Cupertino, CA (US); Chin-Hsiung Ho, Sunnyvale, CA (US); Mei-Yen Li, Tainan (TW); Chien-Kang Chou, Tainan (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/974,584

(22) Filed: Oct. 9, 2001

(65) Prior Publication Data

US 2003/0068902 A1 Apr. 10, 2003

(51) Int. Cl.⁷ ............................. H01L 21/4763
(52) U.S. Cl. ................. 438/622; 438/623; 438/261; 438/593
(58) Field of Search ................... 438/622, 623, 438/261, 593

(56) References Cited

U.S. PATENT DOCUMENTS

| | | | | |
|---|---|---|---|---|
| 3,934,059 A | * | 1/1976 | Polinsky | |
| 5,198,392 A | * | 3/1993 | Fukuda et al. | |
| 5,395,662 A | * | 3/1995 | Bischer, Jr. et al. | |
| 5,620,910 A | * | 4/1997 | Teramoto | |
| 6,056,931 A | * | 5/2000 | Saishoji et al. | |
| 6,143,618 A | * | 11/2000 | Chen et al. | |
| 6,171,890 B1 | * | 1/2001 | Adachi et al. | |
| 6,273,944 B1 | * | 8/2001 | Saishoji et al. | |
| 6,319,784 B1 | * | 11/2001 | Yu et al. | |
| 2002/0123205 A1 | * | 9/2002 | Iwamatsu et al. | |

FOREIGN PATENT DOCUMENTS

| JP | 403022528 A | * | 1/1991 |
|---|---|---|---|
| JP | 408255882 | * | 10/1996 |
| JP | 91289 A | * | 3/2000 |
| JP | 195858 | * | 7/2000 |
| JP | 294551 | * | 10/2000 |
| JP | 2001044192 A | * | 2/2001 |

\* cited by examiner

*Primary Examiner*—Long Pham
(74) *Attorney, Agent, or Firm*—Tung & Associates

(57) ABSTRACT

A method for depositing an inter-metal-dielectric layer on a semiconductor substrate by plasma chemical vapor deposition without the layer cracking defect is disclosed. The semiconductor substrate is first heat-treated in the same plasma process chamber to a temperature of at least 300° C. for a length of time sufficient to outgas a surface of the semiconductor substrate. The impurity gases absorbed on the surface of the semiconductor substrate can be effectively outgassed during the heat treatment process such that they are not trapped under an IMD layer deposited in a subsequent plasma deposition process. The method effectively minimizes or eliminates completely the IMD layer cracking defect of the dielectric layer.

20 Claims, 2 Drawing Sheets

| YIELD | LOT 1 | | LOT 2 | | LOT 3 | |
|---|---|---|---|---|---|---|
| | STD (5 SEC) | HEAT UP 60 SEC | STD (5 SEC) | HEAT UP 60 SEC | STD (5 SEC) | HEAT UP 60 SEC |
| AVERAGE | 79.08 | 91.68 | 79.30 | 90.64 | 81.39 | 91.88 |
| STD | 10.46 | 1.92 | 9.28 | 3.33 | 6.33 | 2.51 |
| MAX | 90.31 | 95.03 | 91.88 | 95.29 | 89.01 | 94.50 |
| MIN | 53.40 | 89.01 | 65.45 | 82.72 | 67.28 | 86.39 |

METHOD FOR DEPOSITING SILICON OXIDE INCORPORATING AN OUTGASSING STEP

FIELD OF THE INVENTION

The present invention generally relates to a method for depositing an inter-metal-dielectric (IMD) layer on a semiconductor substrate and more particularly, relates to a method for depositing a silicon oxide dielectric layer on a silicon wafer by plasma enhanced chemical vapor deposition incorporating a heat-treating step for outgassing prior to the deposition process.

BACKGROUND OF THE INVENTION

In the processing of semiconductor wafers into IC devices, a multiplicity of fabrication steps, i.e., as many as several hundred, are usually required to complete the fabrication of an IC circuit. For instance, various steps of deposition, cleaning, ion implantation, etching and passivation must be completed before an IC chip can be tested and packaged for shipment.

One of the most frequently required processes in the fabrication of IC circuits is the oxide deposition process. Silicon dioxide films can be deposited by a chemical vapor deposition (CVD) method at a reaction temperature as low as 400° C. without consuming silicon in the substrate. The deposition temperature can be further reduced by a plasma-enhanced CVD method. The deposition and the sometimes necessary annealing conditions depend on the application of the oxide layer. When the oxide layer is used as an insulator between conductive layers, the oxide film can be deposited undoped and then densified at elevated temperatures. A common method for depositing silicon dioxide films is the oxidation of silane with oxygen at low pressure and low temperature (such as 400–450° C.). The reaction of silane with nitrous oxide ($NO_2$) can also be used to produce stoichiometric silicon dioxide or silicon-rich oxide by varying the $NO_2/SiH_4$ ratio.

In the $SiO_2$ fabrication process, it is desirable to use the plasma-enhanced CVD method such that the substrate can be kept at a low temperature, for instance, at a temperature of 300° C. or lower. This is achieved by reacting gases in a glow discharge to produce a plasma which then supplies much of the energy needed for the reaction. A plasma can generally be created by applying a high electric field at a frequency of typically 13.5 MHZ in the gas mixture. A plasma thus produced contains high energy electrons, gas molecules, fragments of gas molecules and free radicals. A plasma-enhanced CVD oxide film can be formed by the reaction of silane at a reaction temperature of approximately 350° C. with $N_2O$ in a glow discharge. The oxide film produced by a silane and nitrous oxide gas mixture tends to have better uniformity than the oxide film formed by an oxygen reactant gas. In a typical silane/nitrous oxide reaction, silicon dioxide, nitrogen and hydrogen are produced as the end products.

Prior to the deposition of an oxide film on a wafer surface, it is desirable that the wafer surface be cleaned or treated by a physical or chemical method. For instance, a recently developed technique of plasma assisted cleaning which utilizes plasma energy to create reactive species for cleaning or treatment of a wafer surface. In the plasma cleaning process, the wafer is normally placed remote from the plasma in order to avoid radiation damage to the wafer itself. The chemically reactive species are then removed from the plasma region and supplied to the wafer in the form of an afterglow gas. This type of remote plasma technique, for instance, has been used to create chemical reactions in the gas phase for the removal of organic materials from the surface of a wafer with oxygen, i.e., by a nitrous oxide plasma. A plasma assisted chemical cleaning (or etching) is used when isotropic etching is required or when dimensional control is not critical. One of the common plasma assisted chemical etching methods is the removal of photoresist by an oxygen plasma, sometimes referred to as a plasma ashing process wherein oxygen atoms or ions react with organic materials to form volatile products such as CO, $CO_2$ and $H_2O$. A barrel reactor can be used for the plasma ashing process.

In a conventional process of oxide deposition by the PECVD method, a $N_2O$ plasma treatment is first performed on the wafer surface to remove all contaminants and impurities. The conventional treatment process can be carried out by first providing a stable vacuum in the process chamber and then by the plasma treatment step. The process chamber is then stabilized with stable reactants before the start of a deposition process.

The oxygen plasma treatment process when followed by a PECVD oxide deposition process, creates other processing problems. For instance, when an oxide deposition process proceeds immediately after the $N_2O$ plasma treatment process, residual gases left in the reaction chamber such as moisture, $N_2O$, $O_2$, oxygen ions and photoresist residue can cause problems in the deposition process. The residual gases can be absorbed by the silicon wafer, i.e., at least by a surface layer of the wafer and then driven out of the wafer during a subsequent plasma deposition process conducted at a high deposition temperature such as at about 400° C. The impurity gases, particularly the moisture or water vapor that is absorbed in the silicon surface, cause the most problem since some of the moisture does not have time to escape from the silicon surface and is thus covered by the deposited oxide film leading to void problems. The void problem, or sometimes known as "the bubbling problem," is more severe at the wafer edge where it is more likely for silicon to absorb moisture and to cause cracking in the oxide layer that is subsequently deposited. The cracking or peeling of the oxide layer in turn causes severe quality problems in the subsequently deposited and formed metal interconnect lines, i.e., possible shorting in the metal interconnect lines. The outgassing of the impurity gases, including that of water vapor, during the silicon oxide plasma deposition process must therefore be minimized or eliminated altogether to ensure reliability of the device fabricated and the yield of the fabrication process.

It is therefore an object of the present invention to provide a method for depositing an inter-metal-dielectric layer on a semiconductor wafer that does not have the shortcomings or drawbacks of the conventional deposition process for the IMD layers.

It is another object of the present invention to provide a method for depositing an IMD layer on a semiconductor wafer that does not have cracking or peeling problems of the IMD layer deposited.

It is a further object of the present invention to provide a method for depositing an IMD layer on a semiconductor wafer by incorporating a heat-treating step into the deposition process.

It is another further object of the present invention to provide a method for depositing an IMD layer of silicon oxide on a semiconductor wafer by first conducting an outgassing process during heat treatment to drive out impurity gases absorbed in the wafer surface prior to the deposition process.

It is still another object of the present invention to provide a method for depositing a silicon oxide IMD layer on a semiconductor wafer by heat-treating the wafer at a temperature of at least 300° C. for a length of time sufficient to outgas the wafer surface prior to the deposition process.

It is yet another object of the present invention to provide a method for depositing a silicon oxide IMD layer on a semiconductor wafer by a plasma CVD technique wherein the wafer is first heat-treated at a temperature of at least 350° C. for at least 1 min. to evaporate impurity gases from the wafer surface prior to deposition.

It is still another further object of the present invention to provide a method for depositing an oxide layer on a silicon wafer incorporating the step of heat-treating the silicon wafer at a temperature of at least 350° C. for a length of time sufficient to outgas the wafer and then depositing a silicon oxide layer on the wafer by a plasma enhanced chemical vapor deposition technique.

SUMMARY OF THE INVENTION

In accordance with the present invention, a method for depositing a silicon oxide inter-metal-dielectric layer on a semiconductor wafer incorporating a heat treatment step for outgassing the wafer surface prior to the deposition process is provided.

In a preferred embodiment, a method for depositing an inter-metal-dielectric layer on a semiconductor substrate by plasma chemical vapor deposition can be carried out by the operating steps of first providing a pre-processed semiconductor substrate; positioning the semiconductor substrate in a plasma CVD chamber; heating the semiconductor substrate in the chamber to a temperature of at least 300° C. for a length of time sufficient to outgas a surface of the semiconductor substrate; and conducting a plasma CVD process on the semiconductor substrate and depositing the inter-metal-dielectric layer.

In the method for depositing an inter-metal-dielectric layer on a semiconductor substrate, the semiconductor substrate is preferably heated to a temperature of at least 350° C. during the heating step. The semiconductor substrate may be heated to a temperature of at least 300° C. for a time period of at least 30 sec., or preferably to a temperature of at least 350° C. for a time period of at least 1 min. The method prevents the deposited inter-metal-dielectric layer from cracking due to outgassing from the semiconductor substrate. The inter-metal-dielectric layer deposited may be silicon oxide. The method may further include the step of flowing a precursor gas of silane into the plasma CVD chamber for depositing said IMD layer, or the step of flowing precursor gases of silane and nitrous oxide into the plasma CVD chamber for depositing the IMD layer. The semiconductor substrate may be heated to a temperature of 400° C. for 1 min. during the heating step. The heating step and the depositing step are conducted in the same plasma CVD chamber.

The present invention is further directed to a method for depositing an oxide layer on a semiconductor wafer which can be carried out by the operating steps of first positioning a pre-processed semiconductor wafer in a plasma process chamber; heat-treating the semiconductor wafer at a temperature of at least 350° C. for a length of time sufficient to outgas the wafer; and depositing a silicon oxide layer on the wafer by a plasma enhanced chemical vapor deposition technique.

The method for depositing an oxide layer on a semiconductor wafer may further include the step of positioning a pre-processed silicon wafer in the plasma process chamber. The method may further include the step of heat-treating the semiconductor wafer at a temperature of at least 350° C. for a time period of at least 30 sec., or the step of heat-treating the semiconductor wafer at 400° C. for 1 min. The method may further include the step of evacuating the plasma process chamber prior to the deposition step to a pressure of not higher than $10^{-2}$ Torr, or the step of cleaning a surface of the semiconductor wafer by a nitrous oxide ($N_2O$) plasma. The method may further include the step of flowing a precursor gas of silane into the plasma process chamber to carry out the deposition process, or the step of flowing precursor gases of silane and nitrous oxide into the plasma process chamber to carry out the deposition process. The method may further include the step of depositing the silicon oxide layer as an inter-metal-dielectric layer, or the step of outgassing moisture from the semiconductor wafer during the heat-treating step.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
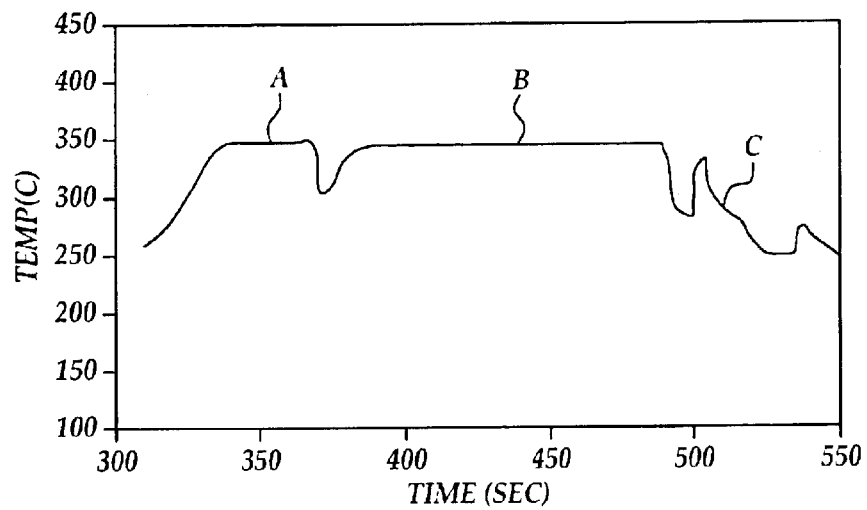
FIG. 1 is a graph illustrating the temperature/time relationship for a present invention plasma deposition process incorporating the heat-treating step.

The present invention discloses a method for depositing an inter-metal-dielectric layer on a semiconductor substrate by plasma chemical vapor deposition incorporating the additional step of heat-treating for outgassing impurity gases from the wafer surface prior to the deposition step such that cracking of the IMD layer deposited can be minimized or eliminated.

In the method, a silicon substrate is first heat-treated in the plasma CVD chamber by plasma energy to a temperature of at least 300° C. for a time period sufficient to outgas the surface of the semiconductor wafer prior to the deposition process. The semiconductor substrate is preferably treated at a temperature of at least 350° C. for a time period of at least 30 sec. In a preferred embodiment, the silicon wafer is heat-treated at a temperature of 400° C. for a time period of 60 sec. The heat treatment step can be carried out in-situ in the plasma process chamber by the plasma energy. The silicon wafer may also be treated in a separate chamber and then immediately transported into the plasma process chamber for the deposition process without exposing the wafer to a source of impurities or moisture.

The present invention deposition process for forming the IMD layer can be carried out, after the heat treatment step, by flowing a precursor gas of silane, or precursor gases of silane and nitrous oxide into the plasma process chamber for the deposition process. The chamber pressure is normally kept at lower than $10^{-2}$ Torr. The process may be carried out at a chamber temperature of about 400° C.

The present invention novel method for treating a dielectric film to suppress high-density plasma (HDP) oxide defect can be carried out before the deposition process of the dielectric film in the plasma process chamber. The high-density plasma CVD method, with its excellent gap filling capability, has largely replaced sub-atmospheric pressure CVD for depositing inter-metal-dielectric layers as the semiconductor fabrication process continuously shrinking to deep-sub-micron levels. The present invention novel method minimizes or eliminates the as-deposited film cracking problem, particularly severe at the wafer edge, which may lead to device defects such as a short between interconnect metal lines.

The present invention novel high-density plasma (HDP) treatment method can be used to heat wafers to a temperature of up to 400° C. to outgas the wafer surface in the HDP chamber prior to the deposition process, such that wafer edge void formation (or bubbling) and cracking can be eliminated. The fabrication yield of the HDP process can be improved by more than 10% when the present invention pre-treatment method is used, for instance, by eliminating shorts between the interconnect lines. The heat treatment process can be advantageously conducted at a temperature between about 300° C. and about 400° C.

The invention provides a solution to HDP-IMD bubble defects which can otherwise lead to film peeling and contamination on the wafers. An average yield improvement can be realized from about 80% to about 91% with a minimal reduction in the wafer production rate. It has been found that the void defect or the bubbling defect occurs more frequently at wafer edge since the wafer edge is more susceptible of exposure to impurity gases, e.g., moisture.

Referring to FIG. 1, wherein a temperature/time plot of the present invention plasma deposition method incorporating a heat treatment step is shown. It is seen that the initial curve, denoted by A, represents the pre-treatment step at a temperature of about 350° C. for a time period of about 50 sec. after a wafer is first positioned in the plasma process chamber and the plasma is turned on without turning on the reactant gas flow. The plasma, which is ignited by the argon gas, bombards the wafer surface and causes it to be heated to a desired temperature which is controlled by the power supply to the plasma source. For instance, the radio frequency (RF) power supply to the plasma source may be in the range between about 1,000 W and about 3,000 W with the bias power switched off during the heat treatment process prior to deposition. After the heat treatment process is conducted for at least 30 sec., and preferably for at least 60 sec., the reactant gas flow, such as a flow of silane and nitrous oxide, is turned on to allow the reactant gases to enter into the process chamber and to carry out the deposition process. This is shown by curve B in FIG. 1. The temporary dip in temperature between curve A and curve B is caused by the sudden flow of reactant gases into the chamber and the absorption of heat in the chamber by the reactant gas before the chamber resumes its set temperature. After the deposition process is completed, i.e., after about 480 sec., the chamber temperature is ramped down as shown in FIG. 1 by curve C.

It should be noted that a minimum of 30 sec. is required for the present invention heat treatment process when conducted at a temperature of about 350° C. The word "about" used in this writing indicates a range of values that is ±10% of the average value given. It was discovered that in some experiments wherein the wafer is pretreated for only 20 sec., the bubbling or void defect does not disappear indicating that the outgassing process from the wafer surface is incomplete. It is therefore determined that a suitable length of time for the heat treatment is between about 30 sec. and about 60 sec. While a heat treatment time of longer than 60 sec. may also be possible, such longer length of time may not be necessary and would reduce the fabrication yield by increasing the cycle time.

Figure 2:
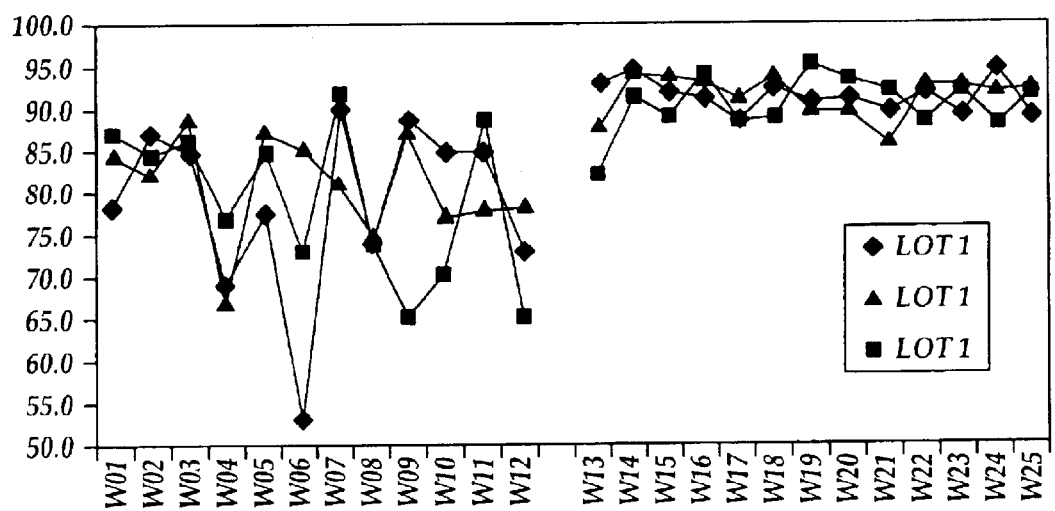
FIG. 2 is a graph illustrating the fabrication yield on wafers processed prior to and after the implementation of the present invention method.
Figures 3, 4:
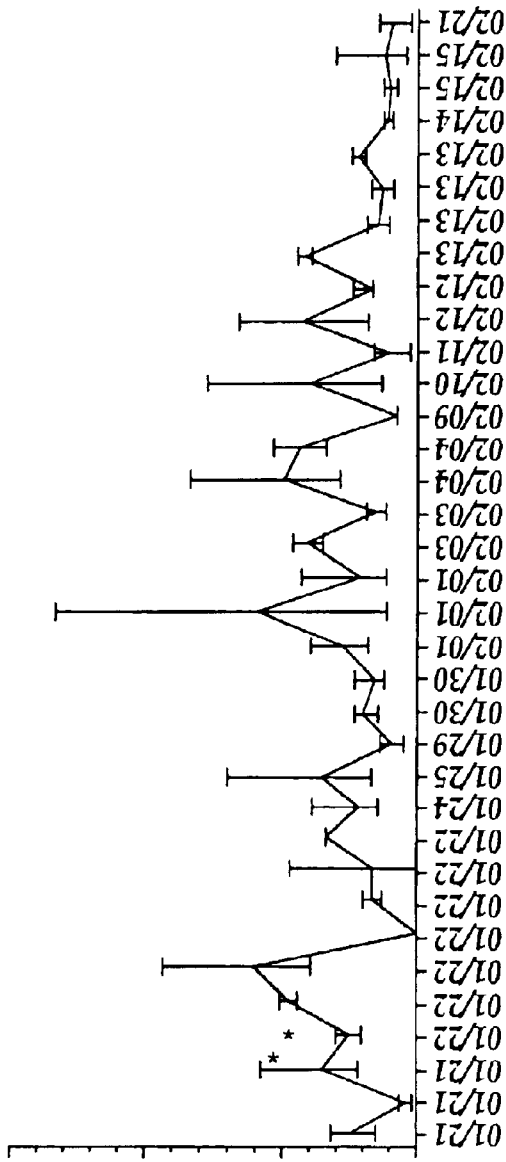
FIG. 3 is a graph illustrating daily defect count on wafers fabricated prior to and after the implementation of the present invention method.
FIG. 4 is a chart illustrating the percentage yield on three different lots of wafers produced with and without the present invention heat-treating step.

The fabrication yields on three lots of wafers, each containing twelve wafers, fabricated by the conventional process (as indicated by W01~W12), and by the present invention novel process (as indicated by W13~W25) are shown in FIG. 2. It is seen that at least a 11% improvement in yield has been realized by utilizing the present invention HDP CVD method for depositing the IMD layer incorporating the heat treatment step. Data is also shown in FIG. 4 indicating that not only the average yield is improved by at least 11%, but also the reliability of the process is improved by achieving a lower standard deviation in the fabrication process, a decrease between of 3 and 5 fold. The present invention novel method therefore not only provides higher fabrication yield, but also produces products of higher reliability and consistency. Also shown in FIG. 4 for comparison is data obtained by the conventional method of heating for a time period of 5 sec. The standard 5 sec. heating process is the time normally required to ramp up the chamber temperature to the deposition temperature.

The desirability and effectiveness of the present invention novel method for depositing IMD layers by a HDP CVD method incorporating the pre-heating step is further shown in FIG. 3. FIG. 3 is a plot of the daily defect count on wafers fabricated prior to and after the implementation of the present invention novel heat treatment method. The implementation of the present invention method is on $2/13$ at near the end of the curve. It is seen that the defect count is significantly reduced after $2/13$ from about 50 to about 20. An improvement of at least 60% in defect count is thus realized by utilizing the present invention novel deposition method incorporating the heat treatment step for outgassing the impurity gases.

The present invention novel method for depositing an inter-metal-dielectric layer on a semiconductor wafer by plasma chemical vapor deposition incorporating a heat treatment step prior to position has therefore been amply described in the above description and in the appended drawings of FIGS. 1–4.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for depositing an inter-metal-dielectric (IMD) layer on a semiconductor substrate by plasma chemical vapor deposition (CVD) comprising the steps of:

providing a pre-processed semiconductor substrate;

positioning said semiconductor substrate in a plasma CVD chamber;

heating said semiconductor substrate in said chamber to a temperature between 300° C. and 400° C. for a length of time sufficient to outgas a surface of said semiconductor substrate; and conducting a plasma CVD process on said semiconductor substrate and depositing said inter-metal-dielectric layer.

2. A method for depositing an inter-metal-dielectric layer according to claim 1, wherein said semiconductor substrate is preferably heated to a temperature between 350° C. and 400° C. during said heating step.

3. A method for depositing an inter-metal-dielectric layer according to claim 1, wherein said semiconductor substrate being heated for a time period of at least 30 sec.

4. A method for depositing an inter-metal-dielectric layer according to claim 1, wherein said semiconductor substrate being heated for a time period of at least 1 min.

5. A method for depositing an inter-metal-dielectric layer according to claim 1, wherein paid method prevents said deposited inter-metal-dielectric layer from cracking due to outgassing from said semiconductor substrate.

6. A method for depositing an inter-metal-dielectric layer according to claim 1, wherein said inter-metal-dielectric (IMD) layer deposited in silicon oxide.

7. A method for depositing an inter-metal-dielectric layer according to claim 1 further comprising the step of flowing a precursor gas of silane into said plasma CVD chamber for depositing said IMD layer.

8. A method for depositing an inter-metal-dielectric layer according to claim 1 further comprising the step of flowing precursor gases of silane and nitrous oxide into said plasma CVD chamber for depositing said IMD layer.

9. A method for depositing an inter-metal-dielectric layer according to claim 1, wherein said semiconductor substrate is heated to a temperature of 400° C. for 1 min.

10. A method for depositing an inter-metal-dielectric layer according to claim 1, wherein said heating step and said depositing step are conducted in the same plasma CVD chamber.

11. A method for depositing an oxide layer on a semiconductor wafer comprising the steps of:

positioning a pre-processed semiconductor wafer in a plasma process chamber;

heat-treating said semiconductor wafer at a temperature between 300° C. and 400° C. for a length of time sufficient to outgas said wafer; and depositing a silicon oxide layer on said wafer by a plasma enhanced chemical vapor deposition technique.

12. A method for depositing an oxide layer on a semiconductor wafer according to claim 11 further comprising the step of positioning a pre-processed silicon wafer in said plasma process chamber.

13. A method for depositing an oxide layer on a semiconductor wafer according to claim 11 further comprising the step of heat-treating said semiconductor wafer for a time period of at least 30 sec.

14. A method for depositing an oxide layer on a semiconductor wafer according to claim 11 further comprising the step of heat-treating said semiconductor wafer at 400° C. for 1 min.

15. A method for depositing an oxide layer on a semiconductor wafer according to claim 11 further comprising the step of evacuating said plasma process chamber prior to said depositing step to a pressure of not higher than $10^{-2}$ Torr.

16. A method for depositing an oxide layer on a semiconductor wafer according to claim 11 further comprising the step of cleaning a surface of said semiconductor wafer by a nitrous oxide ($N_2O$) plasma.

17. A method for depositing an oxide layer on a semiconductor wafer according to claim 11 further comprising the step of flowing a precursor gas of silane into said plasma process chamber to carry out said deposition process.

18. A method for depositing an oxide layer on a semiconductor wafer according to claim 11 further comprising the step of flowing precursor gases of silane and nitrous oxide into said plasma process chamber to carry out said deposition process.

19. A method for depositing an oxide layer on a semiconductor wafer according to claim 11 further comprising the step of depositing said silicon oxide layer as an inter-metal-dielectric layer.

20. A method for depositing an oxide layer on a semiconductor wafer according to claim 11 further comprising the step of outgassing moisture from said semiconductor wafer during said heat-treating step.

* * * * *